(12) United States Patent
Taya et al.

(10) Patent No.: US 8,772,953 B2
(45) Date of Patent: *Jul. 8, 2014

(54) SEMICONDUCTOR DEVICE AND PROGRAMMING METHOD

(75) Inventors: Koji Taya, Kanagawa (JP); Masanori Onodera, Kanagawa (JP); Junji Tanaka, Kanagawa (JP); Kouichi Meguro, Kanagawa (JP)

(73) Assignee: Spansion LLC, Sunnyvale, CA (US)

(*) Notice: Subject to any disclaimer, the term of this patent is extended or adjusted under 35 U.S.C. 154(b) by 400 days.

This patent is subject to a terminal disclaimer.

(21) Appl. No.: 12/404,146

(22) Filed: Mar. 13, 2009

(65) Prior Publication Data
US 2009/0174057 A1 Jul. 9, 2009

Related U.S. Application Data

(63) Continuation of application No. 11/654,703, filed on Jan. 17, 2007, now Pat. No. 7,566,978, which is a continuation-in-part of application No. PCT/JP2006/300543, filed on Jan. 17, 2006.

(51) Int. Cl.
| | |
|---|---|
| H01L 23/48 | (2006.01) |
| B29C 45/16 | (2006.01) |
| H01L 23/28 | (2006.01) |
| B29C 45/02 | (2006.01) |
| H01L 23/31 | (2006.01) |
| H01L 25/065 | (2006.01) |
| H01L 25/00 | (2006.01) |
| H01L 21/56 | (2006.01) |
| H01L 23/00 | (2006.01) |
| H01L 23/552 | (2006.01) |
| B29C 45/14 | (2006.01) |

(52) U.S. Cl.
CPC ............ *H01L 21/56* (2013.01); *B29C 45/1671* (2013.01); *H01L 2224/48227* (2013.01); *H01L 2924/01006* (2013.01); *H01L 2225/0651* (2013.01); *H01L 2924/01029* (2013.01); *H01L 2924/1815* (2013.01); *H01L 23/28* (2013.01); *B29C 45/02* (2013.01); *H01L 23/3135* (2013.01); *H01L 2924/3025* (2013.01); *H01L 25/0657* (2013.01); *H01L 25/50* (2013.01); *H01L 2924/01013* (2013.01); *H01L 2224/85399* (2013.01); *H01L 2224/05599* (2013.01); *H01L 2224/48091* (2013.01); *H01L 2924/01082* (2013.01); *H01L 2924/01033* (2013.01); *H01L 2924/01005* (2013.01); *H01L 2224/48247* (2013.01); *H01L 2924/15311* (2013.01); *H01L 23/552* (2013.01); *H01L 21/565* (2013.01); *B29C 45/14655* (2013.01); *H01L 2224/32145* (2013.01); *H01L 24/48* (2013.01); *H01L 2924/00014* (2013.01); *H01L 23/3128* (2013.01); *H01L 2924/01004* (2013.01); *H01L 2924/014* (2013.01)

USPC ............ 257/790; 257/E23.123; 257/E23.686; 438/124

(58) Field of Classification Search
USPC ................... 257/790, E23.123, 686; 438/124
See application file for complete search history.

(56) References Cited

U.S. PATENT DOCUMENTS

| | | | |
|---|---|---|---|
| 6,181,022 B1 | 1/2001 | Johansson et al. | |
| 6,582,991 B1 | 6/2003 | Maeda et al. | |
| 6,919,223 B2 | 7/2005 | Osada | |
| 7,051,169 B2 * | 5/2006 | Ganton | 711/154 |
| 7,312,785 B2 * | 12/2007 | Tsuk et al. | 345/156 |
| 7,372,137 B2 * | 5/2008 | Saeki | 257/684 |
| 7,469,381 B2 | 12/2008 | Ording | |
| 7,830,666 B2 | 11/2010 | Hiew et al. | |
| 7,834,470 B2 | 11/2010 | Taya et al. | |
| 2004/0012099 A1 * | 1/2004 | Nakayama | 257/787 |
| 2006/0188727 A1 * | 8/2006 | Ito et al. | 428/413 |
| 2007/0194412 A1 | 8/2007 | Nakagawa et al. | |

FOREIGN PATENT DOCUMENTS

| | | |
|---|---|---|
| JP | 2001-7259 A | 1/2001 |
| JP | 2003-080537 | 3/2003 |
| JP | 2003-080537 A | 3/2003 |
| JP | 2003-188198 | 7/2003 |
| JP | 2003-258162 | 9/2003 |
| JP | 2003-258162 A | 9/2003 |
| JP | 2004-172176 | 6/2004 |
| JP | 2005-072392 | 3/2005 |
| JP | 2005-101356 A | 4/2005 |
| JP | 2005-111928 | 4/2005 |
| JP | 2005-157736 A | 6/2005 |
| JP | 2005-242723 | 9/2005 |

* cited by examiner

*Primary Examiner* — Matthew W Such
*Assistant Examiner* — Krista Soderholm

(57) ABSTRACT

The present invention include a semiconductor device and a method therefor, the method includes disposing a sheet-shaped resin at a side opposite to the chip mounting portion mounting semiconductor chips to be mounted on the chip mounting portion, and forming a resin sealing portion between the sheet-shaped resin and the chip mounting portion, to seal the semiconductor chips. According to an aspect of the present invention, it is possible to provide a semiconductor device and a fabrication method therefor, by which it is possible to reduce the size of the package and to prevent the generation of an unfilled portion in a resin sealing portion or a filler-removed portion or to prevent the exposure of wire from the resin sealing portion.

24 Claims, 11 Drawing Sheets

SEMICONDUCTOR DEVICE AND PROGRAMMING METHOD

CROSS-REFERENCES TO RELATED APPLICATIONS

This is a continuation application of application Ser. No. 11/654,703, entitled "Semiconductor Device and Programming Method," filed on Jan. 17, 2007, by Taya et al., which is a continuation-in-part of International Application No. PCT/JP2006/300543, filed Jan. 17, 2006, by the same inventors, assigned to the same, which was not published in English under PCT Article 21(2).

BACKGROUND OF THE INVENTION

1. Field of the Invention

This invention relates generally to semiconductors and fabrication methods therefor, and more particularly, to a semiconductor device having a resin sealing portion and a fabrication method therefor.

2. Description of the Related Art

In recent years, there is a need for reducing the size of semiconductor devices for use in non-volatile memory media or the like of portable electronic devices such as, for example, mobile telephones, and IC memory cards. In order to achieve this need, packages of the semiconductor devices have to be thinner.

Japanese Patent Application Publication No. 8-153832 discloses a technique of forming a resin sealing portion by use of a sheet-shaped resin.

FIG. 1A and FIG. 1B are views illustrating problems posed by the conventional example. Referring to FIG. 1A, semiconductor chips 22 and 24 are stacked and mounted on a wiring substrate 10 of a glass epoxy substrate or the like serving as a chip mounting portion. The semiconductor chips 22 and 24 are electrically coupled to pads 16 of the wiring substrate 10 by means of wires 26 and 28. The semiconductor chips 22 and 24 are resin-sealed by a resin sealing portion 30 of epoxy resin or the like. Land electrodes 12 are provided at a surface of the wiring substrate 10 opposite to another surface on which the semiconductor chips 22 and 24 are mounted, and solder balls 14 are provided at the land electrodes 12. There are also provided in the wiring substrate 10, wires for connecting the pads 16 and coupling portions that couple the pads 16 and the electrodes 12, however, a detailed description will be omitted here.

A distance H between the surface of the semiconductor chip 24 and the top surface of the resin sealing portion 30 is reduced to make the package of the semiconductor device thinner. If so, it will be difficult to fill the resin for sealing between the die that molds the resin sealing portion 30 and the top surface of the semiconductor chip 24 at the time of forming the resin sealing portion 30. This results in the generation of an unfilled portion 90 where the resin is not filled, at the top portion of the semiconductor chip 24. Also, if the distance H is reduced, a filler at the surface of the resin sealing portion 30 will be easily removed, thereby forming a removed portion 91 from which the filler is removed. At the time of printing a mark on the top surface of the resin sealing portion 30, the semiconductor chip 24 will be damaged by laser at the unfilled portion 90 or the removed portion 91. In addition, as indicated by dotted circles 92, the wires 28 may be exposed from the resin sealing portion 30. Therefore, it is difficult to reduce the distance H.

FIG. 1B is a view illustrating the problem of the semiconductor device with the technique disclosed in Japanese Patent Application Publication No. 8-153832. Semiconductor chips 22, 23, and 24 are stacked and mounted on the wiring substrate 10. The semiconductor chips 22, 23, and 24 are sealed by the resin sealing portion 30. Other configurations in FIG. 1B are same as those in FIG. 1A, and a detailed explanation will be omitted here. The resin sealing portion 30 is formed by arranging a sheet-shaped resin on the mold and then providing the semiconductor chips 22, 23, and 24 and the wiring substrate 10 on the sheet-shaped resin. In such case, since the sheet-shaped resin is interposed between the semiconductor chip 24 and the die, no unfilled portion will be generated on the semiconductor chip 24. However, the viscosity of the resin cannot be lowered at the time of forming the resin sealing portion 30 to avoid the exposure of the wire 28. This will produce an unfilled portion 94 where the resin is not filled at a small portion where one semiconductor chip overhangs another, for example, the semiconductor chip 24 overhangs the semiconductor chip 23. Also, the filler has to be additionally provided to the resin sealing portion 30 to maintain the strength of the whole resin sealing portion 30. This cannot prevent the removal of the filler.

SUMMARY OF THE INVENTION

The present invention has been made in view of the above circumstances and provides a semiconductor device and a fabrication method therefor, by which it is possible to reduce the size of the package and to prevent the generation of a resin-unfilled portion in a resin sealing portion or a filler-removed portion or to prevent the exposure of wire from the resin sealing portion.

According to a first aspect of the present invention, there is provided a method for fabricating a semiconductor device including: mounting a semiconductor chip on a chip mounting portion; disposing a sheet-shaped resin at a side of the semiconductor chip opposite to the chip mounting portion; and forming a resin sealing portion between the sheet-shaped resin and the chip mounting portion, to seal the semiconductor chip. It is possible to prevent the generation of a resin-unfilled portion at a surface of the semiconductor chip.

According to a second aspect of the present invention, there is provided a semiconductor device including: a semiconductor chip; a chip mounting portion mounting the semiconductor chip; a sheet-shaped resin portion provided at a side of the semiconductor chip opposite to the chip mounting portion; and a resin sealing portion provided between the sheet-shaped resin and the chip mounting portion, to seal the semiconductor chip. It is possible to prevent the generation of the resin-unfilled portion.

DESCRIPTION OF THE PREFERRED EMBODIMENTS

A description will now be provided, with reference to the accompanying drawings, of embodiments of the present invention.

First Embodiment

Figure 2A:
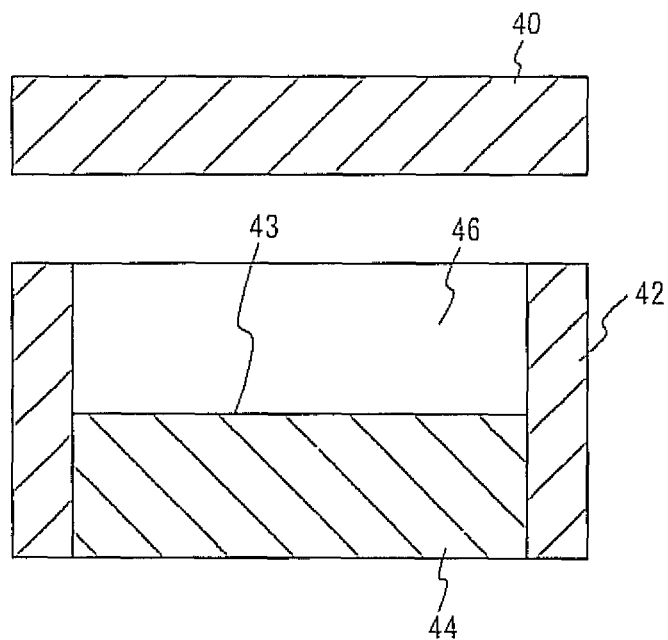
FIG. 2A and FIG. 2B are (first) views illustrating a fabrication method of a semiconductor device in accordance with a first embodiment of the present invention.

A first embodiment is an example in which a wiring substrate 10 is used as a chip mounting portion, and a resin sealing portion 30 is formed by vacuum dipping molding. A description will be given, with reference to FIG. 2A through FIG. 3B, of a fabrication method of a semiconductor device in accordance with a first embodiment of the present invention. Referring to FIG. 2A, there are arranged: an upper die 40 to resin-seal semiconductor chips 22 and 24; and a lower die 44 fit in a frame portion 42. A cavity 46 is defined at an upper portion of the lower die 44 inside the frame portion 42 to form a resin sealing portion. The bottom surface of the cavity 46 corresponds to the top surface of the lower die 44.

Figure 2B:
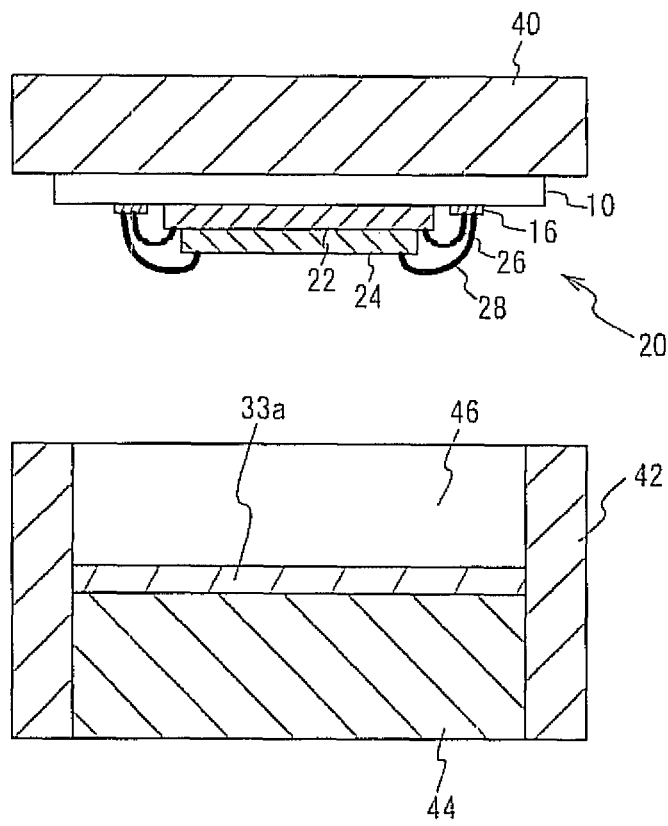

Referring to FIG. 2B, the semiconductor chips 22 and 24 having a thickness of approximately 100 μm are sequentially mounted on the wiring substrate 10. The semiconductor chips 22 and 24 are electrically coupled to pads 16 provided on the wiring substrate 10 by wires 26 and 28 respectively. In this manner, there is formed a sealed substrate 20 in which the semiconductor chips 22 and 24 are mounted on the wiring substrate 10. The sealed substrate 20 is arranged on a surface of the upper die 40, the surface opposing the lower die 44. A sheet-shaped resin 33a having a thickness of approximately 50 μm is disposed at the bottom surface of the cavity 46, the bottom surface corresponding to the surface of the lower die 44 that opposes the upper die 40. That is to say, the sheet-shaped resin 33a is arranged at a side of the semiconductor chip 24 mounted above the wiring substrate 10 opposite to the wiring substrate 10. In other words, the sheet-shaped resin 33a is disposed on a top surface 43 opposed by the semiconductor chip 24 of the lower die 44 that seals the semiconductor chips 22 and 24 with resin. The sheet-shaped resin 33a may be, for example, a thermosetting epoxy resin, and may be provided, for example, in an uncured state. In addition, no filler is added to the sheet-shaped resin 33a.

Figure 3A:
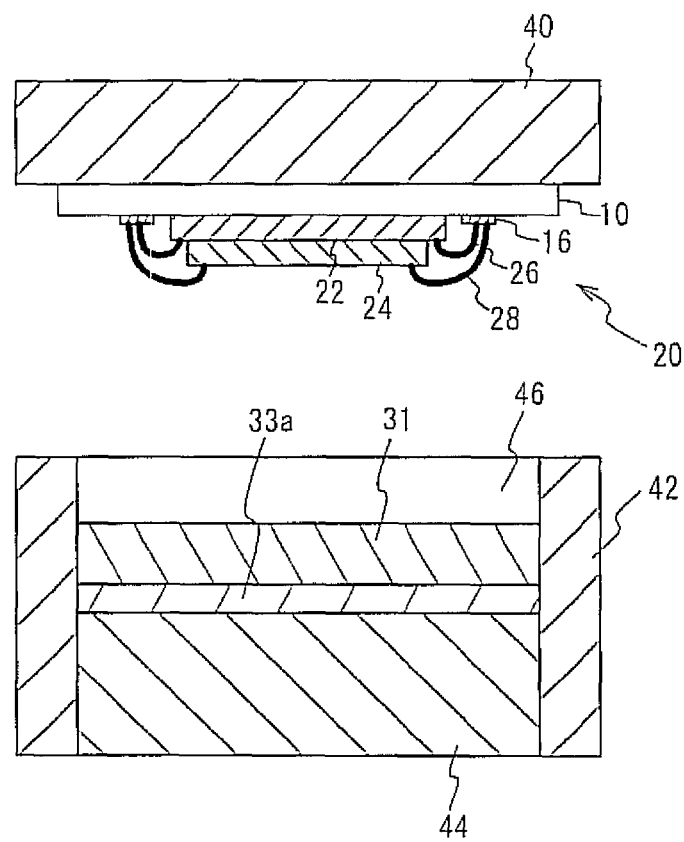
FIG. 3A and FIG. 3B are (second) views illustrating the fabrication method of the semiconductor device in accordance with the first embodiment of the present invention.

Referring to FIG. 3A, an uncured resin 31 of, for example, the thermosetting epoxy resin having a shape of powder, granule, or tablet is disposed on the sheet-shaped resin 33a and at the bottom surface of the cavity 46. That is, the uncured resin 31 for resin-sealing is arranged between the sheet-shaped resin 33a and the semiconductor chip 24. In one embodiment, filler with the average gain diameter of approximately 75 μm is added to the uncured resin 31.

Figure 3B:
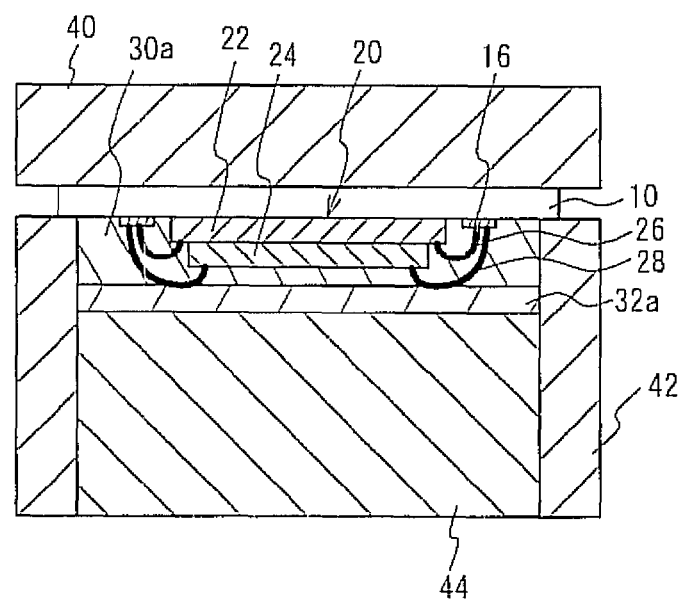

Referring to FIG. 3B, the upper die 40 and the frame portion 42 are put together, and the lower die 44 is moved to the upper portion in the frame 42 at, for example, approximately 175° C. The uncured resin 31 is compressed at high temperature and the compression molding is performed. Here, the sheet-shaped resin 33a is configured to have a higher viscosity than that of the uncured resin 31. By performing the above-described compression molding, the uncured sheet-shaped resin 33a becomes hardened, and a sheet-shaped resin portion 32a is formed. In addition, a resin sealing portion 30a is formed by the uncured resin 31, which is different from the sheet-shaped resin 33a, between the wiring substrate 10 and the sheet-shaped resin 33a. That is, the uncured resin 31 seals the semiconductor chips 22 and 24. Then, the sealed substrate 20 is removed from the dies 40 and 44, and solder balls 14, not shown, are formed at a surface of the wiring substrate 10 opposite to another surface on which the semiconductor chips 22 and 24 are mounted.

Figure 1A:
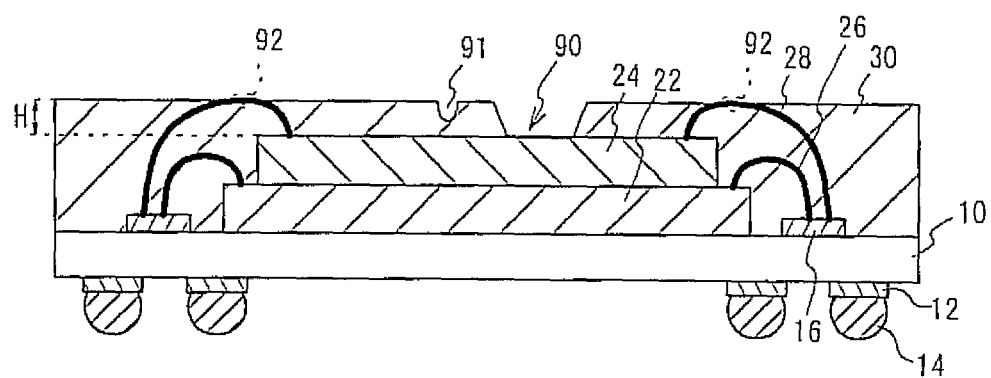
FIG. 1A and FIG. 1B are views illustrating the problem of a semiconductor device of a conventional example.
Figure 1B:
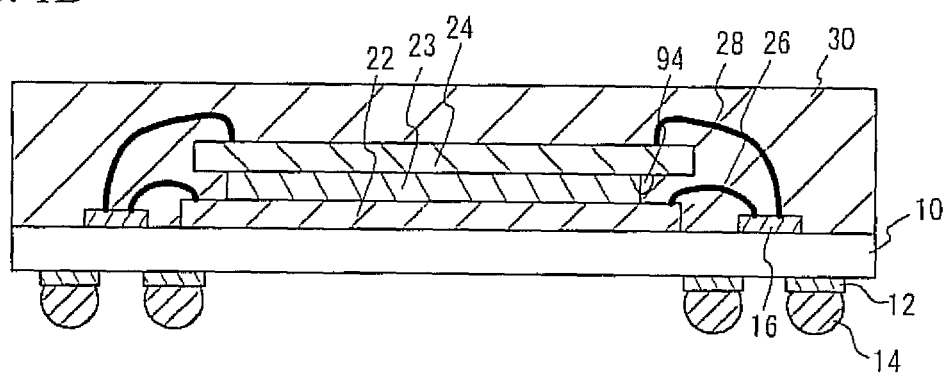
Figure 4:
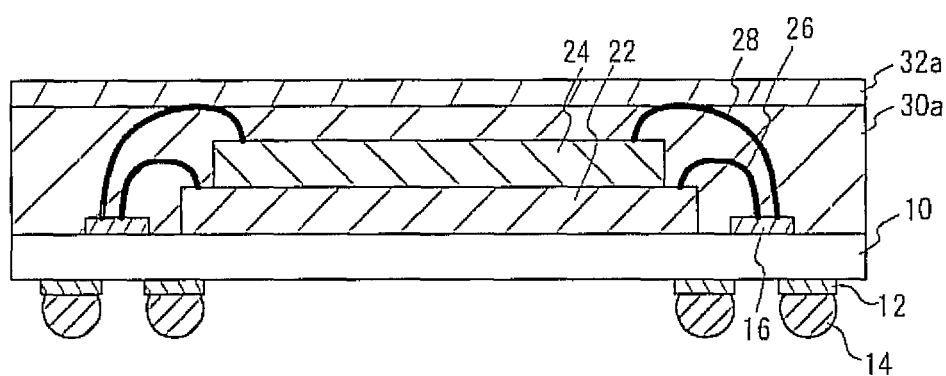
FIG. 4 is a cross-sectional view of the semiconductor device in accordance with the first embodiment of the present invention.

FIG. 4 is a cross-sectional view of the semiconductor device in accordance with the first embodiment of the present invention. Referring to FIG. 4, unlike the configurations of FIG. 1A and FIG. 1B, there are provided the sheet-shaped resin portion 32a at a side of the semiconductor chip 24 opposite to the wiring substrate 10; and the resin sealing portion 30a interposed between the sheet-shaped resin portion 32a and the wiring substrate 10 and sealing the semiconductor chips 22 and 24. In one embodiment, the sheet-shaped resin portion 32a is approximately 50 μm in thickness, and the resin sealing portion 30a, interposed between the sheet-shaped resin portion 32a and the wiring substrate 10, is approximately 50 μm in thickness. Also, the wires 28 are in contact with the sheet-shaped resin portion 32a. Other configurations are same as those shown in FIG. 1A and FIG. 1B, the same configurations have the same reference numerals, and a detailed explanation will be omitted. In one embodiment, the sheet-shaped resin portion 32a is 10-100 μm in thickness.

According to the first embodiment of the present invention, the sheet-shaped resin 33a is disposed at a side of the semiconductor chip 24 opposite to the wiring substrate 10, and the sheet-shaped resin portion 32a is formed, as shown in FIG. 2B. The resin sealing portion 30a that seals the semiconductor chips 22 and 24 is formed between the sheet-shaped resin 33a and the wiring substrate 10, as shown in FIG. 3B. In this manner, the resin sealing portion 30a is formed with the sheet-shaped resin 33a disposed on the surface of the semiconductor chip 24. Hence, it is possible to prevent the generation of a resin-unfilled portion at the surface of the semiconductor chip 24.

In addition, as shown in FIG. 2B, the sheet-shaped resin portion 32a is disposed on a surface of the lower die 44, the surface opposing the semiconductor chip 24, thereby forming the sheet-shaped resin portion 32a on the surface of the semiconductor chip 24.

Furthermore, as shown in FIG. 3A, the uncured resin 31 for resin sealing is disposed and interposed between the sheet-shaped resin 33a and the semiconductor chip 24, to resin-seal the semiconductor chip 24. This makes it possible to provide the resin sealing portion 30a partially between the sheet-shaped resin portion 32a and the semiconductor chip 24. Therefore, it is possible to prevent the generation of the resin-unfilled portion.

Furthermore, the sheet-shaped resin 33a disposed in FIG. 2B is a resin to which the filler is not added. Hence, the sheet-shaped resin portion 32a in FIG. 4 is a resin that does not include the filler. This makes it possible to prevent the generation of the filler removed portion, unlike FIG. 1A. Also, the strength of the resin portion can be maintained by adding the filler to the resin sealing portion 30a.

Furthermore, the higher viscosity of the sheet-shaped resin 33a can prevent the wires 28 from being embedded in the sheet-shaped resin 33a during the molding process. Accordingly, the wires 28 are formed in contact with the sheet-shaped resin portion 32a. This makes it possible to prevent the exposure of the wires 28 from the resin portion.

Second Embodiment

Figure 5A:
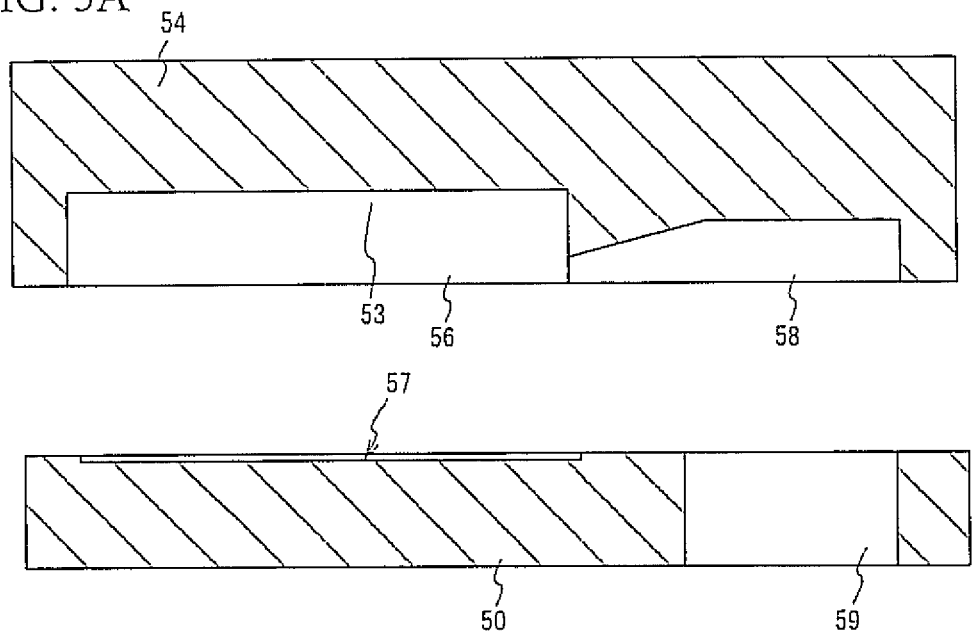
FIG. 5A and FIG. 5B are (first) views illustrating a fabrication method of a semiconductor device in accordance with a second embodiment of the present invention.

A second embodiment is an example in which the wiring substrate 10 is used as a chip mounting portion and a resin sealing portion 30b is formed by transfer molding. A description will be given, with reference to FIG. 5A through FIG. 6B, of a fabrication method of a semiconductor device in accordance with a second embodiment of the present invention. Referring to FIG. 5A, there are arranged an upper die 54 and a lower die 50 to resin-seal the semiconductor chips 22 and 24. A depression portion 57 is defined in the lower die 50 to dispose the sealed substrate 20, and a cavity 56 is defined in the upper die 54 to mold the resin sealing portion 30b. In addition, a storing portion 59 is provided in the lower die 50, and an injection path 58 is provided in the upper die 54 to guide resin to the cavity 56.

Figure 5B:
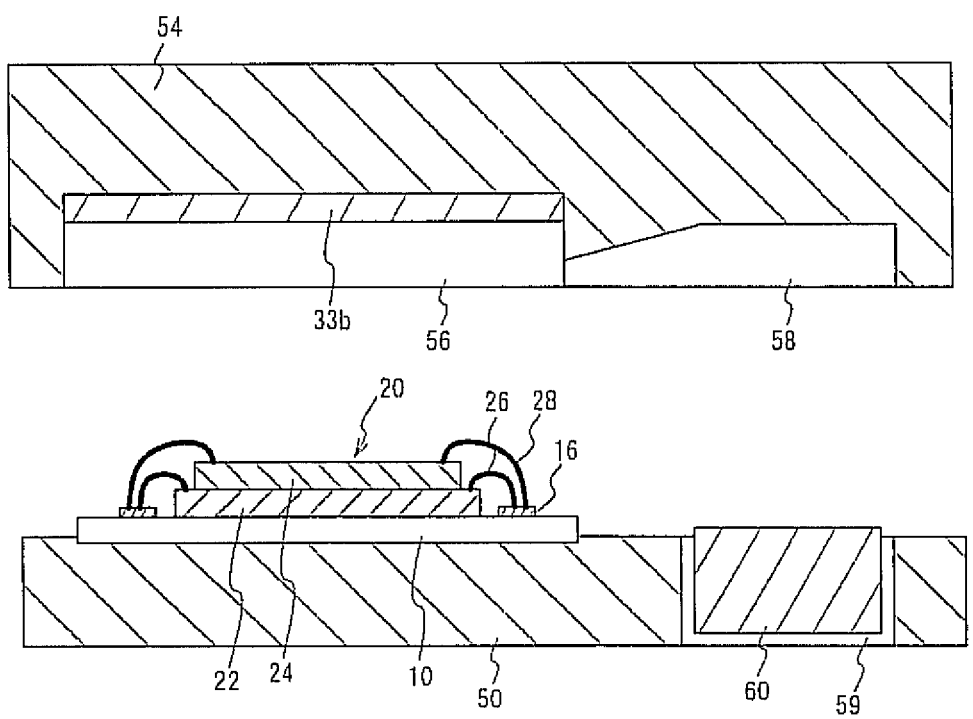

Referring to FIG. 5B, the sealed substrate 20 is disposed in the depression portion 57. The configuration of the sealed substrate 20 is same as that employed in the first embodiment, the same configurations have the same reference numerals, and a detailed explanation will be omitted. A sheet-shaped resin 33b is disposed on the top surface of the cavity 56 in the upper die 54. In one embodiment, the sheet-shaped resin 33b has a thickness of approximately 100 μm. That is, the sheet-shaped resin 33b is arranged at a side of the semiconductor chip 24 mounted above the wiring substrate 10, opposite to the wiring substrate 10. In other words, the sheet-shaped resin 33b is disposed on a surface 53 of the upper die 54 for resin sealing the semiconductor chips 22 and 24, the surface 53 opposing the semiconductor chip 24. The sheet-shaped resin 33b is a thermosetting epoxy resin without a filler, and is provided in an uncured state. An uncured resin 60 is disposed in the storing portion 59 of the lower die 50. The uncured resin is a thermosetting epoxy resin that includes a filler, as described above with respect to FIGS. 2A-4.

Figure 6A:
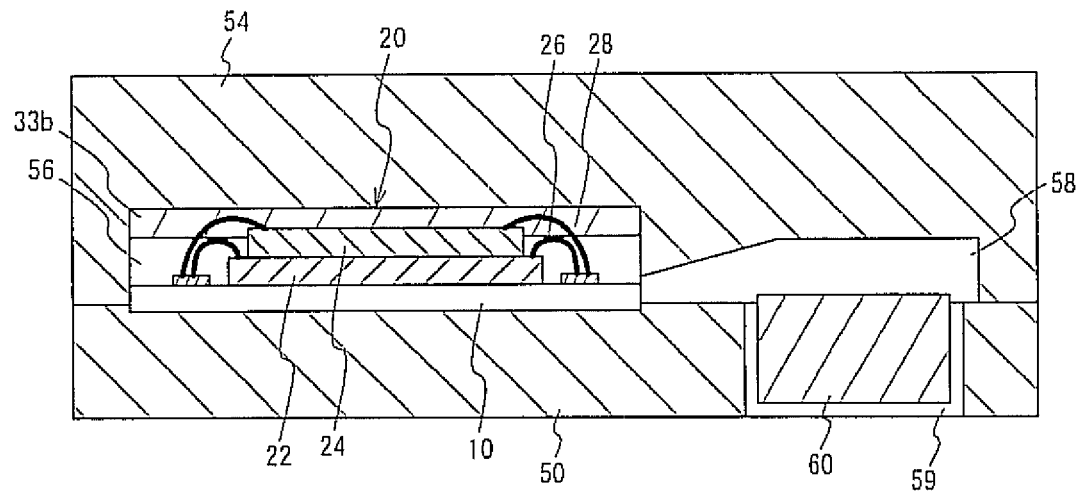
FIG. 6A and FIG. 6B are (second) views illustrating the fabrication method of the semiconductor device in accordance with the second embodiment of the present invention.
Figure 6B:
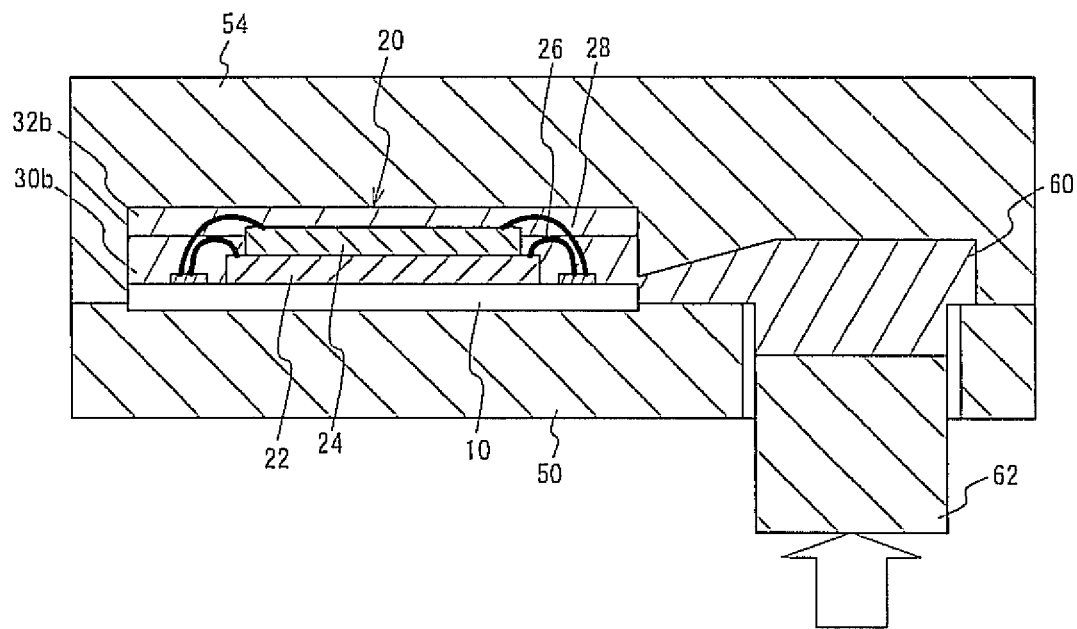

Referring to FIG. 6A, the upper die 54 and the lower die 50 are put together, and are heated at, for example, 175° C. Here, the sheet-shaped resin 33b is lower in viscosity than the sheet-shaped resin 33a described above, and the wires 28 are at least partially embedded in the sheet-shaped resin 33b. The sheet-shaped resin 33b is arranged in contact with the semiconductor chip 24. Referring to FIG. 6B, by guiding an inserting portion 62 to the storing portion 59, the uncured resin 60 is passed through the injection path 58 and injected between the sheet-shaped resin 33b and the sealed substrate 20. In the above manner, the uncured sheet-shaped resin 33b is hardened into a sheet-shaped resin portion 32b. Also, the uncured resin 60 is injected between the wiring substrate 10 and the sheet-shaped resin 33b, the semiconductor chips 22 and 24 are sealed, and the resin sealing portion 30b is molded. That is, the uncured resin 60 seals the semiconductor chips 22 and 24. In addition, the upper die 54 and the lower die 50 are arranged vice versa to arrange the sealed substrate 20 in the lower die and the sheet-shaped resin 33b in the upper die. Then, the sealed substrate 20 is removed from the dies 50 and 54, and the solder balls 14, not shown, are formed at a surface of the wiring substrate 10 opposite to another surface on which the semiconductor chips 22 and 24 are mounted.

Figure 7:
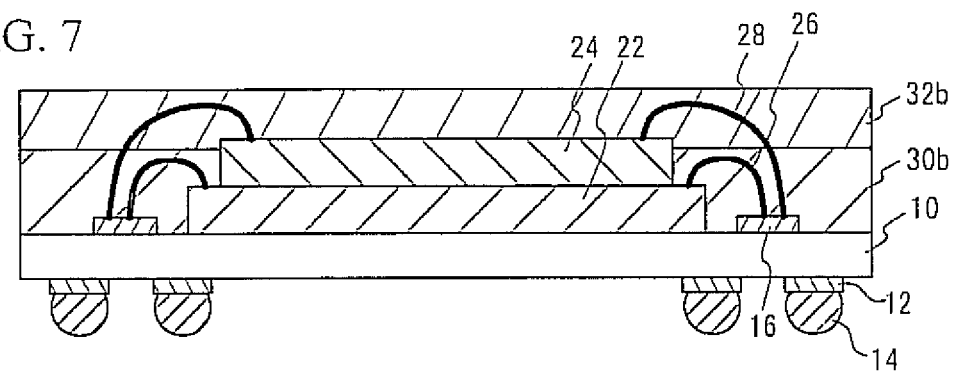
FIG. 7 is a cross-sectional view of the semiconductor device in accordance with the second embodiment of the present invention.
Figure 8:
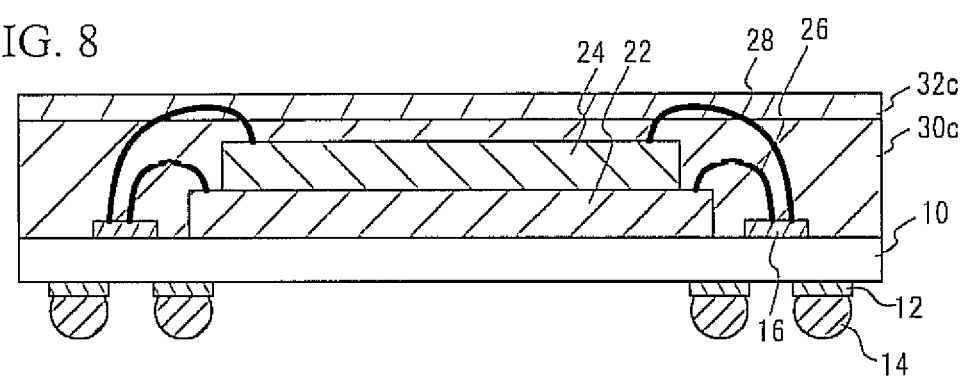
FIG. 8 is a cross-sectional view of the semiconductor device in accordance with a third embodiment of the present invention.

FIG. 7 is a cross-sectional view of the semiconductor device in accordance with the second embodiment of the present invention. Referring to FIG. 7, unlike the configuration of FIG. 4, the wires 28 are embedded in the sheet-shaped resin portion 32b, and the sheet-shaped resin portion 32b is provided in contact with the semiconductor chip 24. Other configurations are same as those in FIG. 4, the same configurations have the same reference numerals, and a detailed explanation will be omitted. In addition, the thickness of the sheet-shaped resin portion 32b is approximately falls in the range of 10 to 150 μm on thickness in accordance with one embodiment. Preferably, this thickness is about 100 μm.

When the resin sealing is performed by transfer molding, the uncured resin 60 is demanded to be injected between the semiconductor chip 24 and the upper die 54 to make the package thinner. This may easily generate a resin-unfilled portion. Hence, as shown in FIG. 6A and FIG. 6B, the semiconductor chips 22 and 24 are sealed with resin so that the sheet-shaped resin 33b may be brought into contact with the semiconductor chip 24. That is, the sheet-shaped resin portion 32b is provided in contact with the semiconductor chip 24. Also, the wires 28 are at least partially embedded in the sheet-shaped resin portion 32b. This makes it possible to prevent the generation of the resin-unfilled portion between the semiconductor chip 24 and the sheet-shaped resin 33b, even in the case of sealing with resin by transfer molding.

In accordance with the first and second embodiments, the semiconductor chips 22 and 24 are stacked semiconductor chips. When the semiconductor chips are stacked and the package thereof is to be made thinner, the resin portion on the semiconductor chip 24 becomes thinner, and, in particular, the resin-unfilled portion or the filler removed portion may be easily produced and the wire may be easily exposed. Accordingly, the effects of the present invention can be further brought, by applying the present invention to the above-described circumstance.

Third Embodiment

A third embodiment is an example in which a resin sealing portion 30c is also provided between a sheet-shaped resin portion 32c and the semiconductor chip 24, and the wires 28 are embedded in the sheet-shaped resin portion 32c. When the vacuum dipping molding is employed as in the first embodiment, the wires 28 can be embedded in the sheet-shaped resin portion 32c. This makes it possible to make the package thinner than that employed in the first embodiment.

Fourth Embodiment

Figure 9:
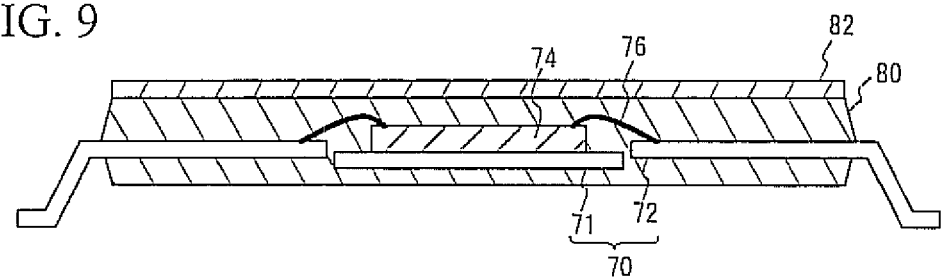
FIG. 9 is a cross-sectional view of the semiconductor device in accordance with a fourth embodiment of the present invention.

A fourth embodiment is an embodiment in which a lead frame 70 is employed as a chip mounting portion. Referring to FIG. 9, the lead frame 70 includes a lead 72 and a mounting portion 71. A semiconductor chip 74 is mounted on the mounting portion 71. A sheet-shaped resin portion 82 is provided at a side of the semiconductor chip 74 opposite to the mounting portion 71. A portion of the lead 72, the mounting portion 71, and the semiconductor chip 74 are sealed by a resin sealing portion 80. The resin sealing portion 80 is arranged between the sheet-shaped resin portion 82 and the mounting portion 71, and the semiconductor chip 74 is sealed by resin. In this manner, even when the semiconductor chip 74 is mounted on the lead frame 70, the sheet-shaped resin portion 82 may be provided. This makes it possible to prevent the generation of the resin-unfilled portion or the exposure of the wire.

Fifth Embodiment

Figure 10:
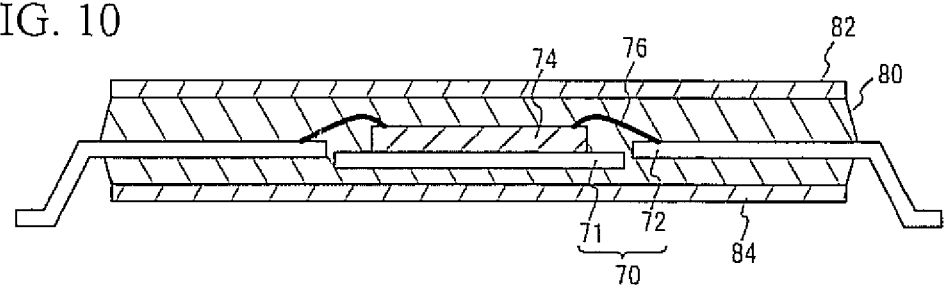
FIG. 10 is a cross-sectional view of the semiconductor device in accordance with a fifth embodiment of the present invention.

In the package having the lead frame 70 therein, the resin sealing portion 80 is provided at the top and bottom of the mounting portion 71 of the lead frame 70, as shown in FIG. 9. Accordingly, in the fifth embodiment, as shown in FIG. 10, a second sheet-shaped resin portion 84 is arranged at a side of the mounting portion 71 opposite to the semiconductor chip 74 and the resin sealing portion 80 seals the sheet-shaped resin portion 82 and the second sheet-shaped resin portion 84, in addition to the configuration employed in the fourth embodiment. This will make it possible to prevent the generation of the resin-unfilled portion, even if the resin sealing portion 80 provided at a side of the mounting portion 71 opposite to the semiconductor chip 74. In accordance with the fourth and fifth embodiments, it is possible to prevent the generation of the filler removed portion, if no filler is added to the sheet-shaped resin portion 82 or the second sheet-shaped resin portion 84.

Sixth Embodiment

Figure 11:
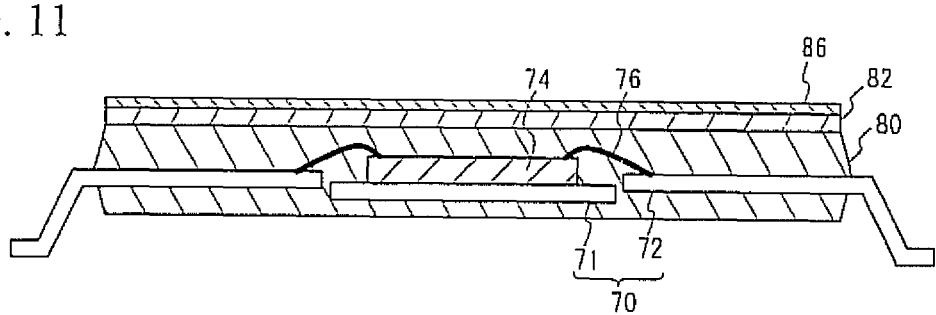
FIG. 11 is a (first) cross-sectional view of the semiconductor device in accordance with a sixth embodiment of the present invention.
Figure 12:
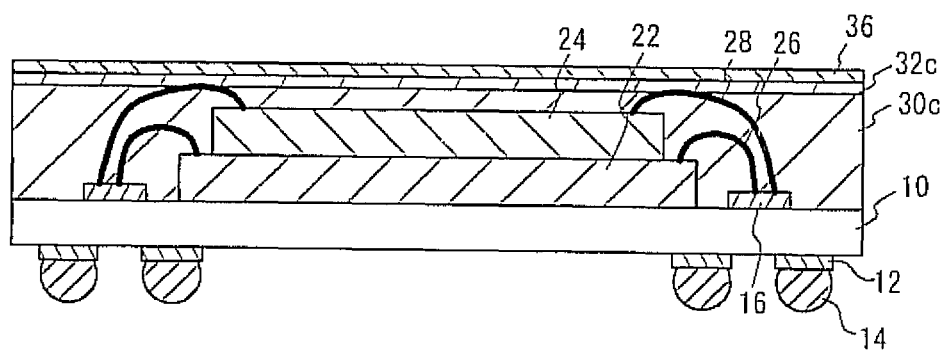
FIG. 12 is a (second) cross-sectional view of the semiconductor device in accordance with the sixth embodiment of the present invention.

In a sixth embodiment, a conductive sheet 86 is provided at a side of the sheet-shaped resin portion 82 opposite to the semiconductor chip 74, in addition to the semiconductor device employed in the fourth embodiment, as shown in FIG. 11. Also, a conductive sheet 36 is provided at a side of the sheet-shaped resin portion 32c opposite to the semiconductor chip 24, in addition to the semiconductor device employed in the third embodiment, as shown in FIG. 12. The conductive sheets 86 and 36 may have a configuration in which a wiring is embedded, for example, in a metal sheet or an insulating film. An example of the configuration includes a copper wiring embedded in a glass epoxy resin. Electromagnetic waves can be shielded by providing the conductive sheets 86 and 36. This can suppress the radio interference. Also, the conductive sheets 86 and 36 serve as heat sinks. In addition, it is possible to suppress the warp of the package. Furthermore, it is possible to prevent the damage applied to the semiconductor chips 74 and 24 at the time of printing a mark by means of laser.

In addition to the thermosetting epoxy resin, for example, thermoset polyimide resin, maleimide resin, silicone resin, phenol resin, polyurethane resin, or acrylic resin may be used for sheet-shaped resin portions 32, 82, and 84 and the resin sealing portions 30 and 80. In addition to the wiring substrate 10 having a wiring pattern in the insulating substrate and the lead frame 70 made of a metal material, a member that can mount the semiconductor chip thereon may be used for the chip mounting portion. The sheet-shaped resin portions 32a through 32c are examples in which no filler is included, however, the filler may be added.

Embodiments generally relate to semiconductor devices. More particularly, embodiments allow for smaller semiconductor devices. In one implementation, the various embodiments are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells", each of which traditionally stores one bit of information. However, newer flash memory devices, such as MirrorBit® Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit® technology has several key advantages. For example, flash memory that utilizes MirrorBit® technology is capable of burst-mode access as fast as 80 MHz, page access times as fast as 25 ns, simultaneous read-write operation for combined code and data storage, and low standby power (e.g., 1 µA).

Figure 13:
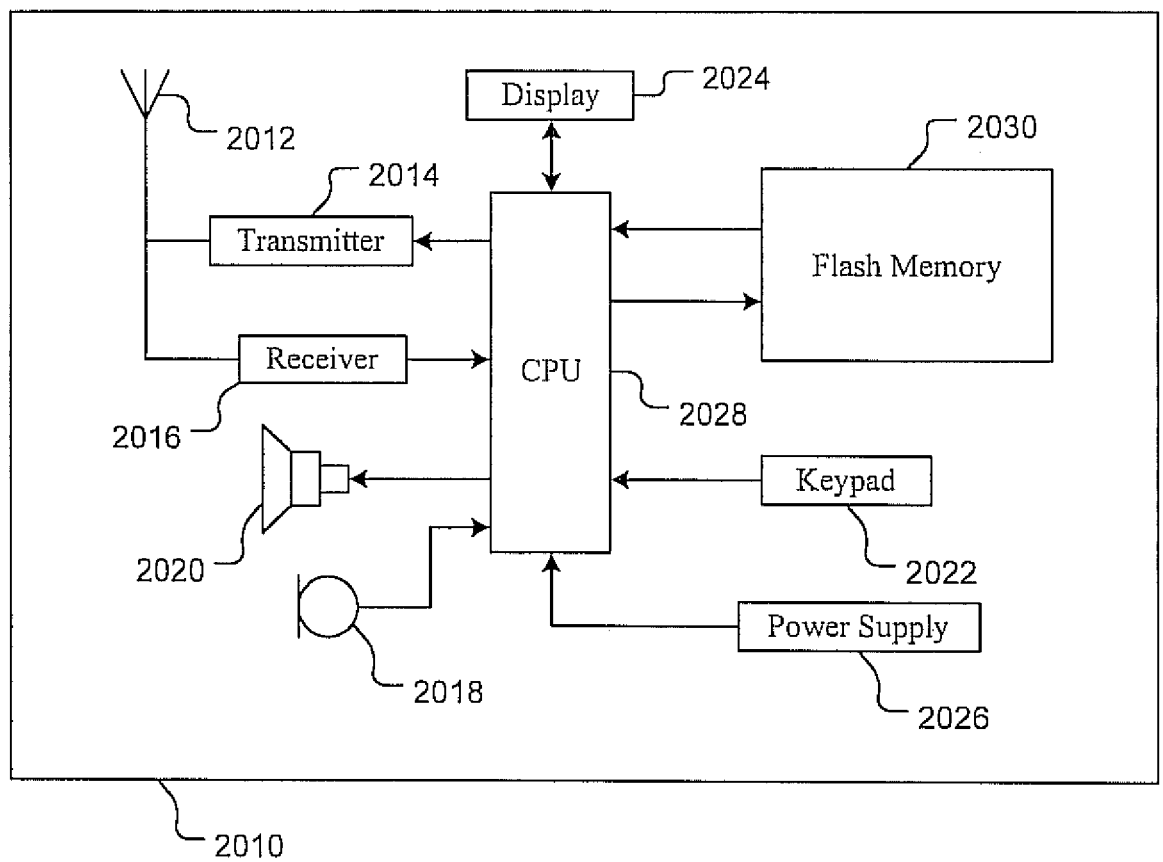
FIG. 13 illustrates a block diagram of a conventional portable phone, upon which embodiments may be implemented.

FIG. 13 shows a block diagram of a conventional portable telephone 2010 (e.g., cell phone, cellular phone, mobile phone, internet protocol phone, wireless phone, etc.), upon which embodiments can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes a semiconductor chip, a chip mounting portion mounting the semiconductor chip, a sheet-shaped resin portion provided at a side of the semiconductor chip opposite to the chip mounting portion, and a resin sealing portion provided between the sheet-shaped resin and the chip mounting portion, to seal the semiconductor chip. According to various embodiments, it is possible to provide a semiconductor device, such as flash memory, which has a reduced package size and does not include an unfilled portion in a resin sealing portion or a filler-removed portion or does not have an exposed wire from the resin sealing portion. The present invention also provides a method of manufacturing such a semiconductor device. As a result, the flash memory 2030 is able to be manufactured in a much smaller package than previous. This decreased size for the flash memory translates into decreased size for various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a less expensive flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 14:
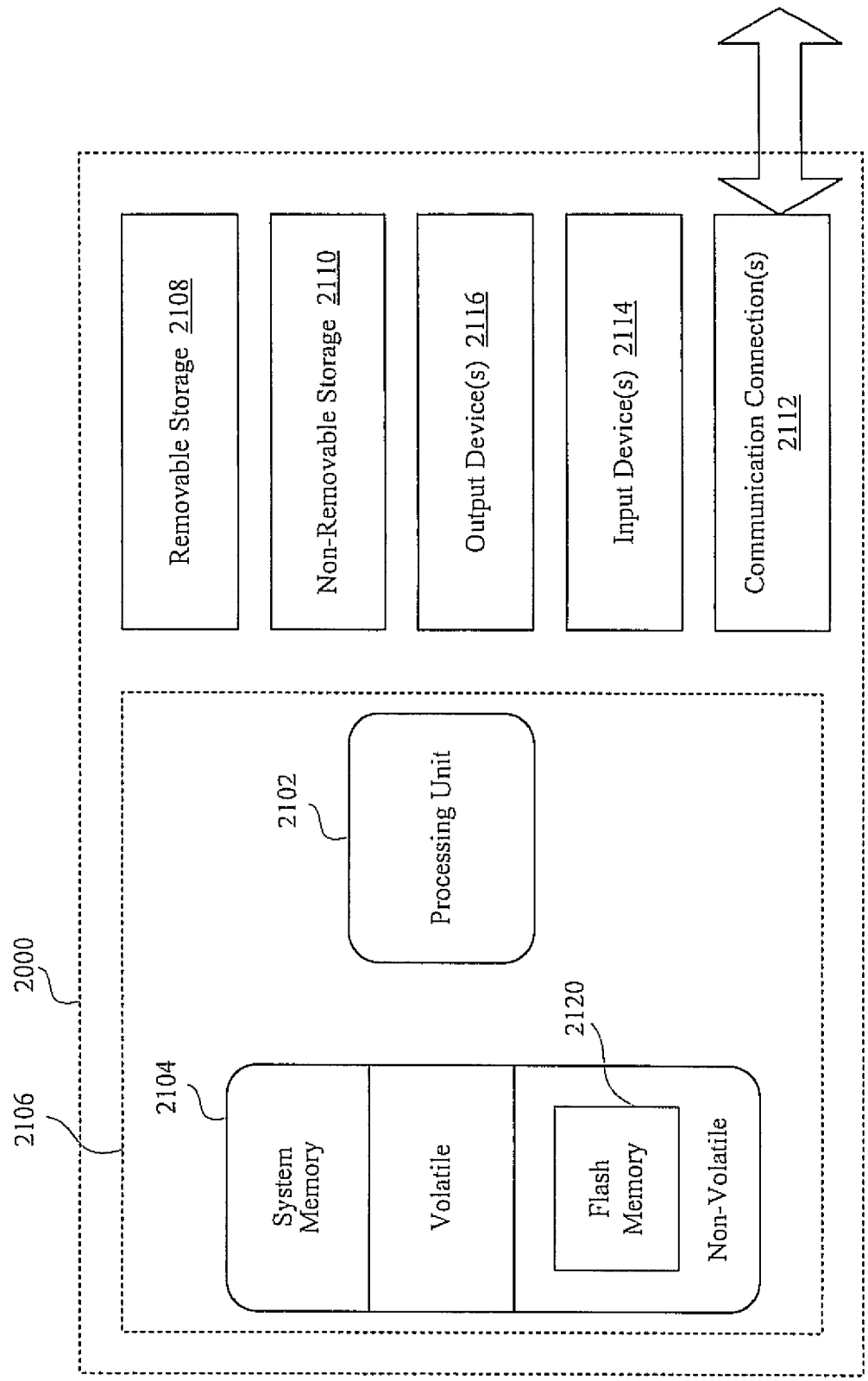
FIG. 14 illustrates a block diagram of a computing device, upon which embodiments may be implemented.

FIG. 14 illustrates a block diagram of a computing device 2100, upon which embodiments of the present invention can be implemented. Although computing device 2100 is shown and described in FIG. 14 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 14.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 11 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 14 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: a semiconductor chip, a chip mounting portion mounting the semiconductor chip, a sheet-shaped resin portion provided at a side of the semiconductor chip opposite to the chip mounting portion, and a resin sealing portion provided between the sheet-shaped resin and the chip mounting portion, to seal the semiconductor chip. According to various embodiments, it is possible to provide a semiconductor device, such as flash memory, which has a reduced package size and does not include an unfilled portion in a resin sealing portion or a filler-removed portion or does not have an exposed wire from the resin sealing portion. The present invention also provides a method of manufacturing such a semiconductor device. As a result, the flash memory 2030 is able to be manufactured in a much smaller package than previous. This decreased size for the flash memory translates into decreased size for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes MirrorBit® technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Users would also benefit from reduced memory read time and reduced cost.

Figure 15:
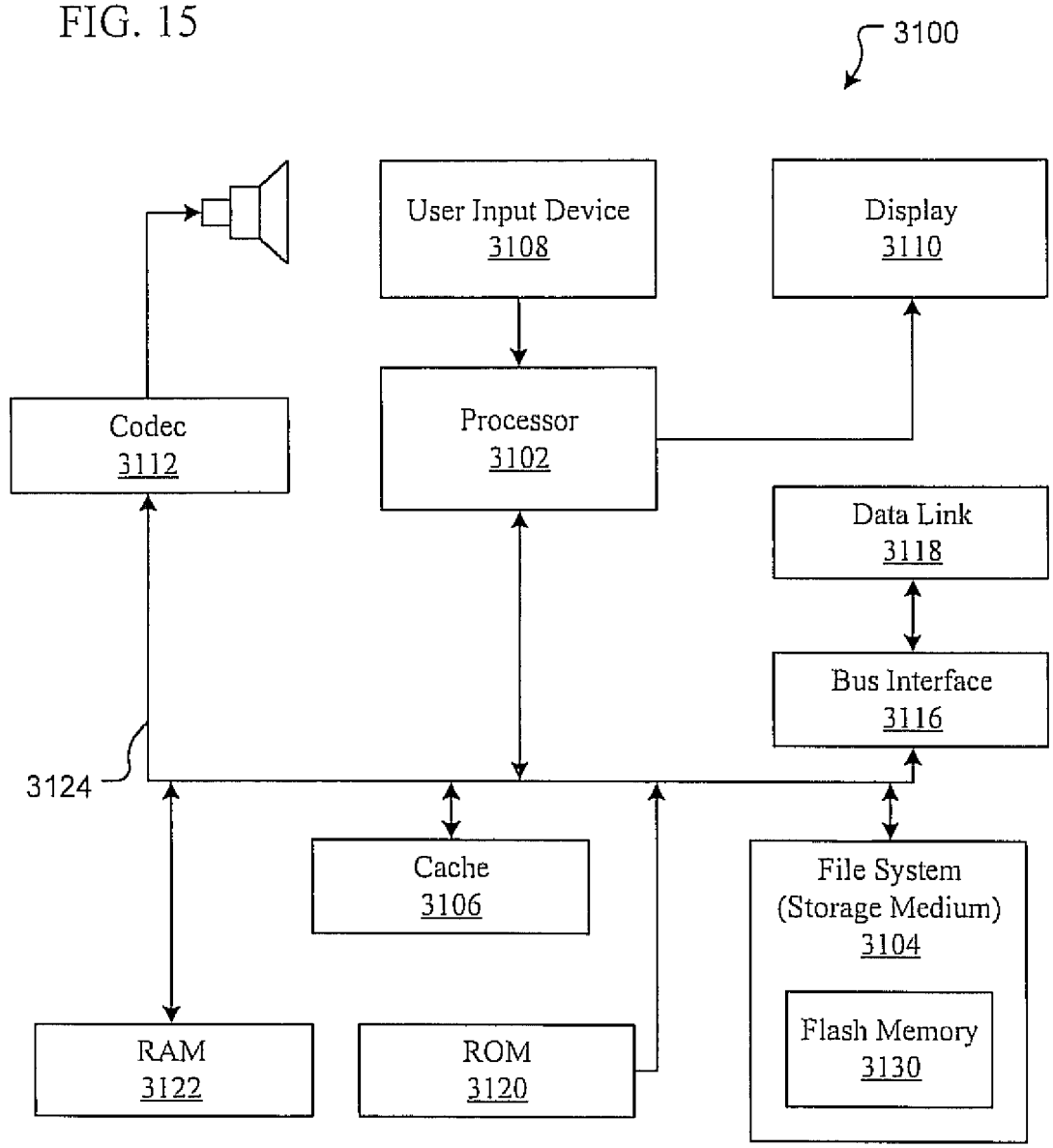
FIG. 15 illustrates an exemplary portable multimedia device, or media player, in accordance with various embodiments of the present invention.

FIG. 15 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, the flash memory 3130 comprises: a semiconductor chip, a chip mounting portion mounting the semiconductor chip, a sheet-shaped resin portion provided at a side of the semiconductor chip opposite to the chip mounting portion, and a resin sealing portion provided between the sheet-shaped resin and the chip mounting portion, to seal the semiconductor chip. According to various embodiments, it is possible to provide a semiconductor device, such as flash memory, which has a reduced package size and does not include an unfilled portion in a resin sealing portion or a filler-removed portion or does not have an exposed wire from the resin sealing portion. The present invention also provides a method of manufacturing such a semiconductor device. As a result, the flash memory 2030 is able to be manufactured in a much smaller package than previous. This decreased size for the flash memory translates into decreased size for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that connect to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Finally, various aspects of the present invention are summarized in the following.

According to a first aspect of the present invention, there is provided a method for fabricating a semiconductor device including: mounting a semiconductor chip on a chip mounting portion; disposing a sheet-shaped resin at an opposite side of the semiconductor chip with respect to the chip mounting portion; and forming a resin sealing portion between the sheet-shaped resin and the chip mounting portion, to seal the semiconductor chip.

In the above-described method, disposing the sheet-shaped resin may include disposing the sheet-shaped resin on a surface of a die to seal the semiconductor chip, the surface opposing the semiconductor chip. It is possible to form a seat resin portion at a surface of the semiconductor chip.

In the above-described method, forming the resin sealing portion may include: disposing an uncured resin between the sheet-shaped resin and the semiconductor chip; and sealing the semiconductor chip by the uncured resin. It is possible to further prevent the generation of a resin-unfilled portion In the above-described method, forming the resin sealing portion may be forming the resin sealing portion by transfer molding. It is possible to prevent the generation of the resin-unfilled portion, even with the forming method of the resin sealing portion with the use of the transfer molding that may generate the resin-unfilled portion.

In the above-described method, the sheet-shaped resin may not include a filler. It is possible to prevent the generation of the filler-removed portion.

In the above-described method, forming the resin sealing portion may include partially forming the resin sealing portion between the sheet-shaped resin and the semiconductor chip. It is possible to further prevent the generation of the resin-unfilled portion.

In the above-described method, disposing the sheet-shaped resin may be disposing the sheet-shaped resin in contact with the semiconductor chip. With this configuration, it is possible to further prevent the generation of the resin-unfilled portion.

In the above-described method, the semiconductor chip may have stacked semiconductor chips. It is possible to downsize the package of the stacked semiconductor chips, although it is difficult to thin the package thereof.

According to a second aspect of the present invention, there is provided a semiconductor device including: a semiconductor chip; a chip mounting portion mounting the semiconductor chip; a sheet-shaped resin portion provided at an opposite side of the semiconductor chip with respect to the chip mounting portion; and a resin sealing portion provided between the sheet-shaped resin and the chip mounting portion, to seal the semiconductor chip. It is possible to prevent the generation of the resin-unfilled portion.

In the above-described device, the sheet-shaped resin may not include a filler. It is possible to prevent the generation of the filler-removed portion in the resin portion.

In the above-described device, the resin sealing portion may be partially provided between the sheet-shaped resin portion and the semiconductor chip. It is possible to further prevent the generation of the resin-unfilled portion.

In the above-described device, the sheet-shaped resin portion may be provided in contact with the semiconductor chip. It is possible to further prevent the generation of the resin-unfilled portion.

The above-described device may further include a wire connected between the semiconductor chip and the chip mounting portion, and the wire may be provided in contact with the sheet-shaped resin portion. It is possible to prevent the exposure of the wire from the resin portion.

The above-described device may further include a wire connected between the semiconductor chip and the chip mounting portion, and the wire may be partially embedded in the sheet-shaped resin portion. It is possible to further prevent the generation of the resin-unfilled portion.

The above-described device may further include a second sheet-shaped resin portion at an opposite side of the chip mounting portion with respect to the semiconductor chip, and the resin sealing portion may be provided between the sheet-shaped resin portion and the second sheet-shaped resin portion. It is possible to prevent the generation of the resin-unfilled portion, even when the resin sealing portions are provided at both sides of the chip mounting portion and the resin sealing portion at the side where the semiconductor chip is not mounted, is made thin.

The above-described device may further include a conductive sheet provided at an opposite side of the sheet-shaped resin with respect to the semiconductor chip. It is possible to prevent a damage caused by radio interference, warp of the package, printing a mark by means of laser.

In the above-described device, the semiconductor chip may have stacked semiconductor chips. It is possible to downsize the package of the stacked semiconductor chips, although it is difficult to thin the package thereof.

It is possible to provide a semiconductor device and a fabrication method therefor, by which it is possible to reduce the size of the package and to prevent the generation of an unfilled portion in a resin sealing portion or a filler removed portion or to prevent the exposure of wire from the resin sealing portion.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method for fabricating a semiconductor device comprising:
   mounting a semiconductor chip on a chip mounting portion;
   coupling a wire between the semiconductor chip and the chip mounting portion
   disposing a sheet-shaped resin at a side of the semiconductor chip opposite to the chip mounting portion; and
   forming a resin sealing portion between the sheet-shaped resin and the chip mounting portion, to seal the semiconductor chip, wherein the wire is provided in contact with the sheet-shaped resin portion.

2. The method as claimed in claim 1, wherein disposing the sheet-shaped resin includes disposing the sheet-shaped resin on a surface of a die to seal the semiconductor chip, the surface opposing the semiconductor chip.

3. The method as claimed in claim 2, wherein forming the resin sealing portion includes:
   disposing an uncured resin between the sheet-shaped resin and the semiconductor chip; and
   sealing the semiconductor chip by the uncured resin.

4. The method as claimed in claim 1, wherein forming the resin sealing portion is forming the resin sealing portion by transfer molding.

5. The method as claimed in claim 1, wherein the sheet-shaped resin does not include a filler.

6. The method as claimed in claim 1, wherein forming the resin sealing portion includes partially forming the resin sealing portion between the sheet-shaped resin and the semiconductor chip.

7. The method as claimed in claim 1, wherein disposing the sheet-shaped resin is disposing the sheet-shaped resin in contact with the semiconductor chip.

8. The method as claimed in claim 1, wherein the semiconductor chip has stacked semiconductor chips.

9. The method as claimed in claim 1 wherein the wire is partially embedded in the sheet-shaped resin portion.

10. A wireless communications device, comprising:
a memory comprising:
- a semiconductor chip;
- a chip mounting portion mounting the semiconductor chip;
- a sheet-shaped resin portion provided at a side of the semiconductor chip opposite to the chip mounting portion;
- a resin sealing portion provided between the sheet-shaped resin and the chip mounting portion, to seal the semiconductor chip; and
- a wire connected between the semiconductor chip and the chip mounting portion, wherein the wire is provided in contact with the sheet-shaped resin portion;

a processor;
a communications component;
a transmitter;
a receiver; and
an antenna connected to the transmitter circuit and the receiver circuit.

11. The wireless communications device of claim 10, wherein said memory is NAND flash memory.

12. The wireless communications device of claim 10, wherein said memory is NOR flash memory.

13. The wireless communications device of claim 10, wherein said memory comprises at least one memory cell operable to store more than one bit.

14. The wireless communications device of claim 10, wherein the wire is partially embedded in the sheet-shaped resin portion.

15. A computing device comprising:
a processor;
an input component;
an output component;
a memory comprising:
- a semiconductor chip;
- a chip mounting portion mounting the semiconductor chip;
- a sheet-shaped resin portion provided at a side of the semiconductor chip opposite to the chip mounting portion;
- a resin sealing portion provided between the sheet-shaped resin and the chip mounting portion, to seal the semiconductor chip; and
- a wire connected between the semiconductor chip and the chip mounting portion, wherein the wire is provided in contact with the sheet-shaped resin portion.

16. The computing device of claim 15, wherein said computing device is a personal computer (PC).

17. The computing device of claim 15, wherein said computing device is a personal digital assistant (PDA).

18. The computing device of claim 15, wherein said computing device is a gaming system.

19. The computing device of claim 15, wherein the wire is partially embedded in the sheet-shaped resin portion.

20. A portable media player comprising:
a processor;
a cache;
a user input component;
a coder-decoder component; and
a memory comprising:
a semiconductor chip;
a chip mounting portion mounting the semiconductor chip;
a sheet-shaped resin portion provided at a side of the semiconductor chip opposite to the chip mounting portion;
a resin sealing portion provided between the sheet-shaped resin and the chip mounting portion, to seal the semiconductor chip; and
a wire connected between the semiconductor chip and the chip mounting portion, wherein the wire is provided in contact with the sheet-shaped resin portion.

21. The portable media player of claim 20, wherein said portable media player is a portable music player.

22. The portable media player of claim 20, wherein said portable media player is a portable video player.

23. The portable media player of claim 20, wherein said memory comprises:
a wire connected between the semiconductor chip and the chip mounting portion, wherein the wire is provided in contact with the sheet-shaped resin portion.

24. The portable media player of claim 20, wherein the wire is partially embedded in the sheet-shaped resin portion.

* * * * *